(12) United States Patent
Nagahara et al.

(10) Patent No.: US 6,503,828 B1
(45) Date of Patent: Jan. 7, 2003

(54) PROCESS FOR SELECTIVE POLISHING OF METAL-FILLED TRENCHES OF INTEGRATED CIRCUIT STRUCTURES

(75) Inventors: Ronald J. Nagahara, San Jose, CA (US); James J. Xie, San Jose, CA (US); Akihisa Ueno, Cupertino, CA (US); Jayanthi Pallinti, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/882,124

(22) Filed: Jun. 14, 2001

(51) Int. Cl.$^7$ .................... H01L 21/4763; H01L 21/461
(52) U.S. Cl. .................. 438/633; 438/626; 438/634; 438/645; 438/745
(58) Field of Search ................. 438/633, 634, 438/734, 626, 627, 645, 687, 628, 625, 692, 631, 635, 624

(56) References Cited

U.S. PATENT DOCUMENTS

| | | |
|---|---|---|
| 5,245,790 A | 9/1993 | Jerbic |
| 5,265,378 A | 11/1993 | Rostoker |
| 5,290,396 A | 3/1994 | Schoenborn et al. |
| 5,298,110 A | 3/1994 | Schoenborn et al. |
| 5,310,455 A | 5/1994 | Pasch et al. |
| 5,321,304 A | 6/1994 | Rostoker |
| 5,389,194 A | 2/1995 | Rostoker et al. |
| 5,403,228 A | 4/1995 | Pasch |
| 5,441,094 A | 8/1995 | Pasch |
| 5,471,091 A | 11/1995 | Pasch et al. |
| 5,516,400 A | 5/1996 | Pasch et al. |
| 5,532,516 A | 7/1996 | Pasch et al. |
| 5,618,381 A * | 4/1997 | Doan et al. ................. 438/633 |
| 5,624,304 A | 4/1997 | Pasch et al. |
| 5,626,715 A | 5/1997 | Rostoker |
| 5,667,433 A | 9/1997 | Mallon |
| 5,674,774 A | 10/1997 | Pasch et al. |
| 5,861,055 A | 1/1999 | Allman et al. |

(List continued on next page.)

OTHER PUBLICATIONS

S. Wolf, "Silicon Processing for the VLSI Era—vol. 1—Process Technology, " 1986 by Lattice Press, vol. 1, pp. 407–409.*

Primary Examiner—Olik Chaudhuri
Assistant Examiner—Timothy Sutton
(74) Attorney, Agent, or Firm—John P. Taylor

(57) ABSTRACT

The invention provides a process for selectively polishing a main electrically conductive layer of an integrated circuit structure by the steps of forming a polishing barrier layer over depressed regions of the main electrically conductive layer; and polishing the portion of the main electrically conductive layer not covered by the polishing barrier layer. The integrated circuit structure treated by the process of the invention contains one or more openings in a layer of dielectric material, and the main electrically conductive layer fills the one or more openings such that the depressed regions of the main electrically conductive layer overlie said one or more openings.

31 Claims, 5 Drawing Sheets

U.S. PATENT DOCUMENTS

| | | |
|---|---|---|
| 5,888,120 A | 3/1999 | Doran |
| 5,948,697 A | 9/1999 | Hata |
| 5,957,757 A | 9/1999 | Berman |
| 6,004,188 A * | 12/1999 | Roy .......................... 451/41 |
| 6,051,496 A * | 4/2000 | Jang ......................... 438/687 |
| 6,060,370 A | 5/2000 | Hsia et al. |
| 6,066,266 A | 5/2000 | Osugi et al. |
| 6,069,082 A * | 5/2000 | Wong et al. ............... 438/692 |
| 6,077,783 A | 6/2000 | Allman et al. |
| 6,093,656 A * | 7/2000 | Lin .......................... 438/734 |
| 6,103,625 A * | 8/2000 | Marcyk et al. ............ 438/691 |
| 6,114,215 A | 9/2000 | Osugi et al. |
| 6,114,246 A * | 9/2000 | Weling ..................... 438/691 |
| 6,115,233 A | 9/2000 | Seliskar et al. |
| 6,169,028 B1 * | 1/2001 | Wang et al. ............... 438/653 |
| 6,242,805 B1 * | 6/2001 | Weling ..................... 257/752 |
| 6,247,998 B1 | 6/2001 | Wiswesser et al. |
| 6,258,711 B1 * | 7/2001 | Laursen .................... 438/633 |
| 6,284,586 B1 | 9/2001 | Seliskar et al. |
| 6,362,092 B1 * | 3/2002 | Shieh et al. ............... 438/631 |
| 6,403,469 B1 * | 6/2002 | Tsai et al. .................. 438/622 |
| 2002/0022370 A1 * | 2/2002 | Sun et al. .................. 438/691 |

* cited by examiner

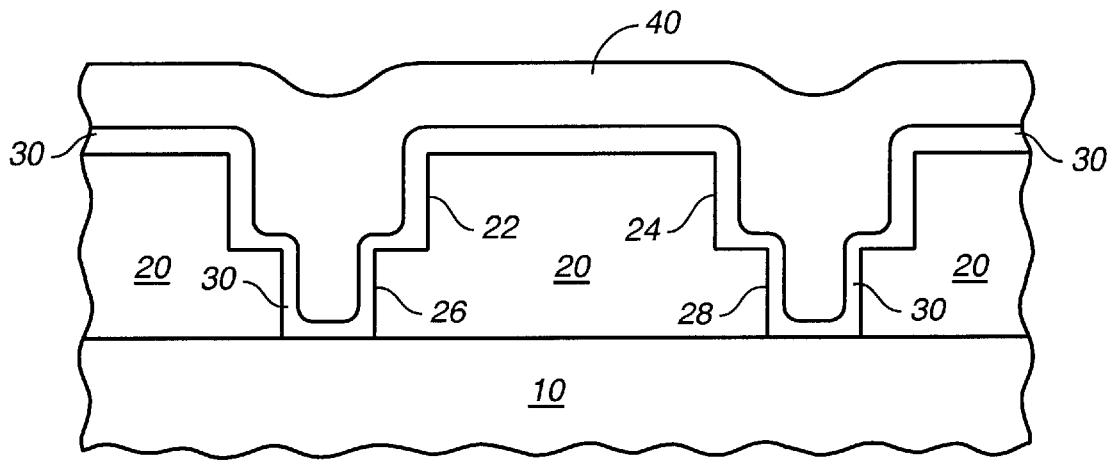
FIG._1 (PRIOR ART)
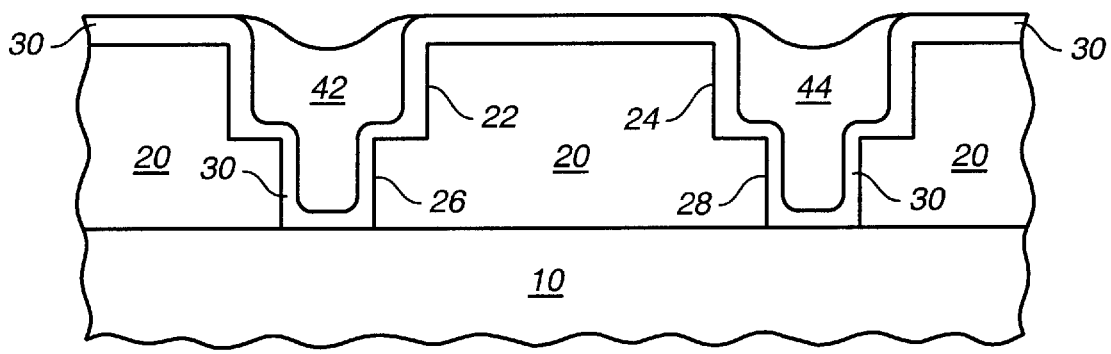
FIG._2 (PRIOR ART)
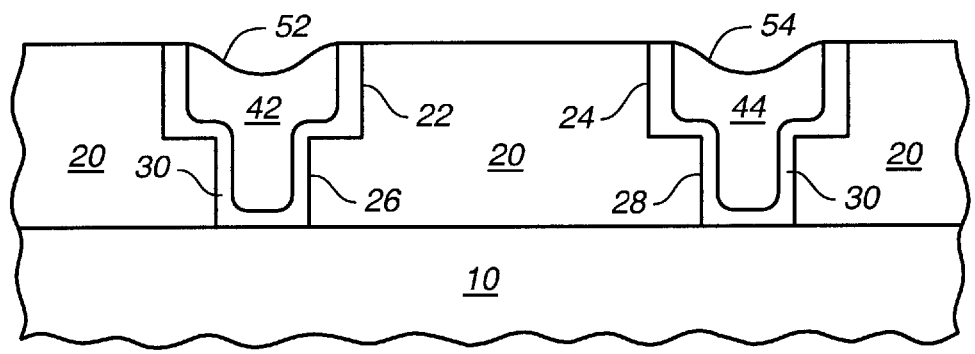
FIG._3 (PRIOR ART)

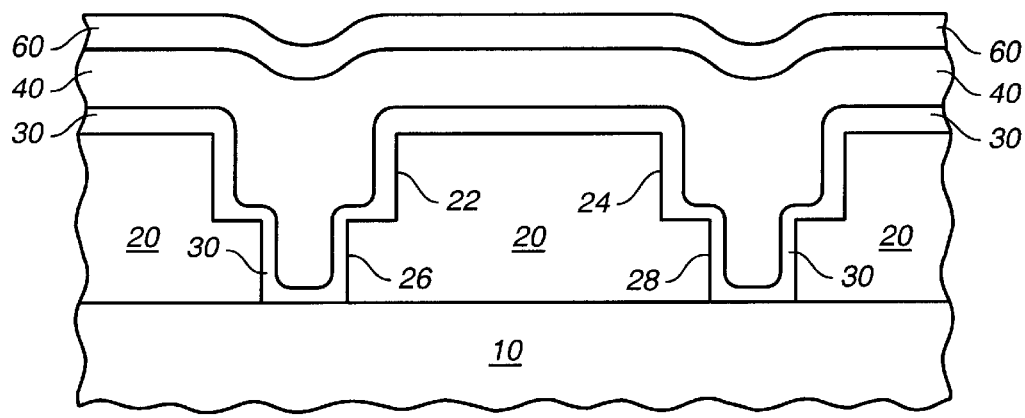
FIG._4
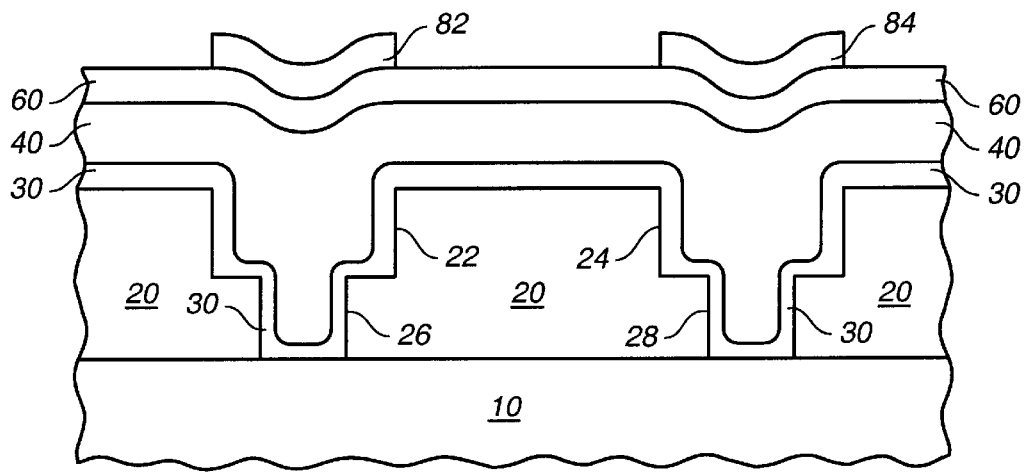
FIG._5
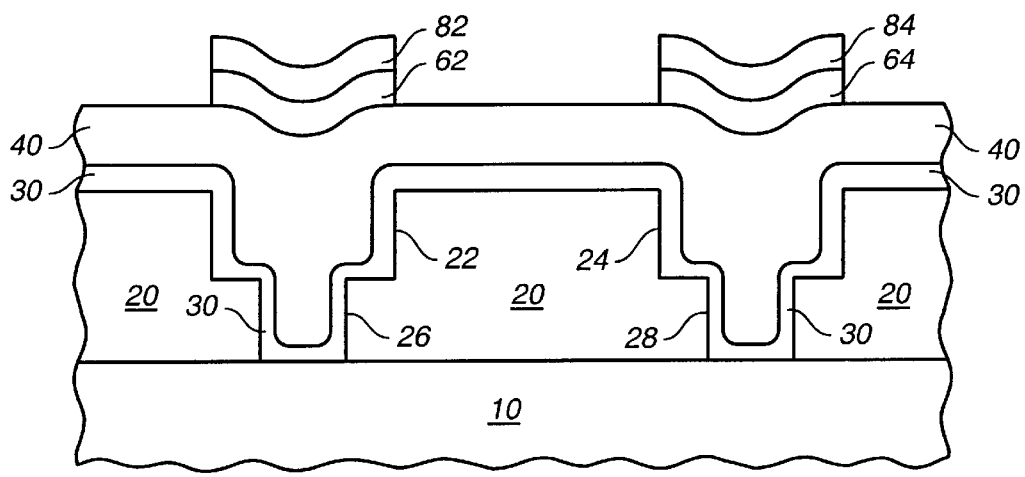
FIG._6

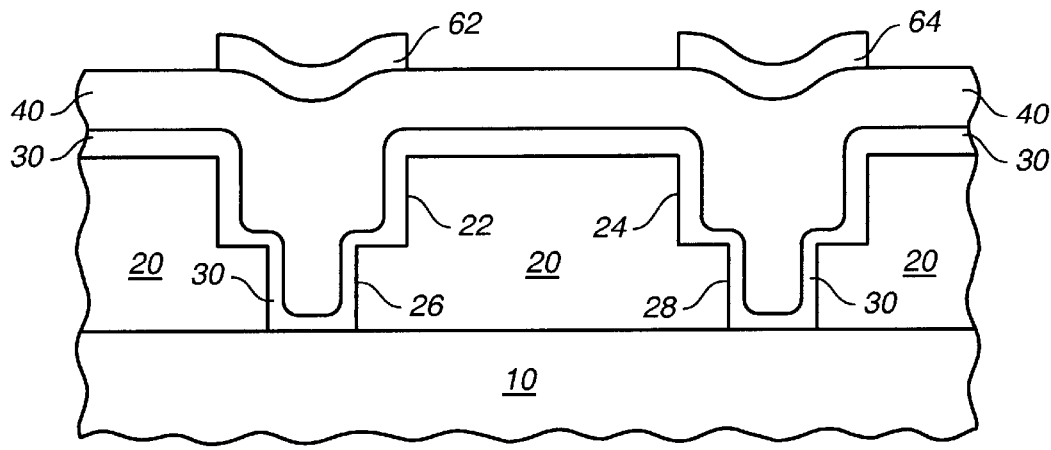
FIG._7
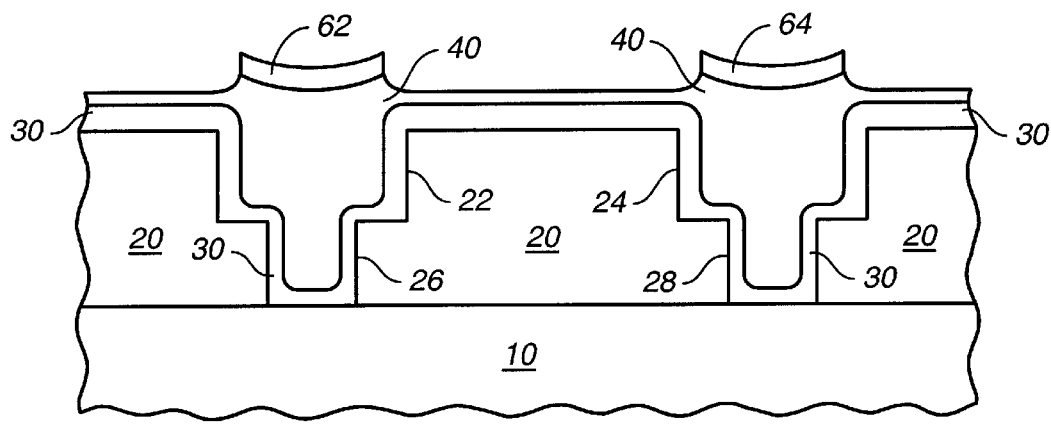
FIG._8
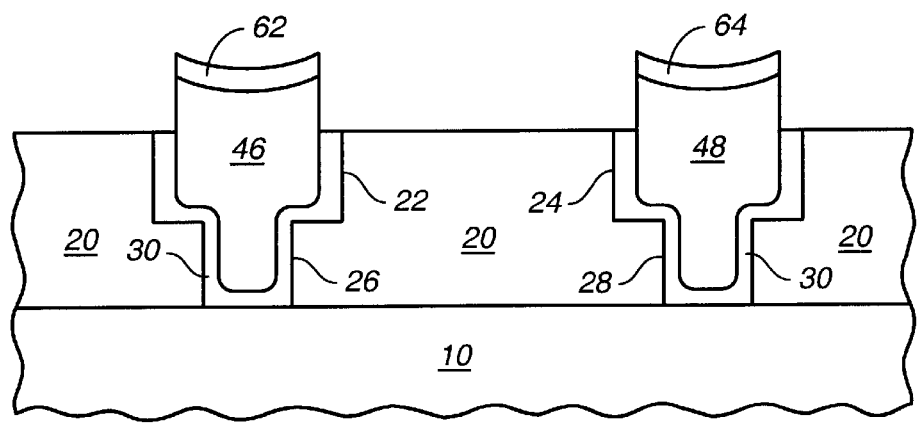
FIG._9

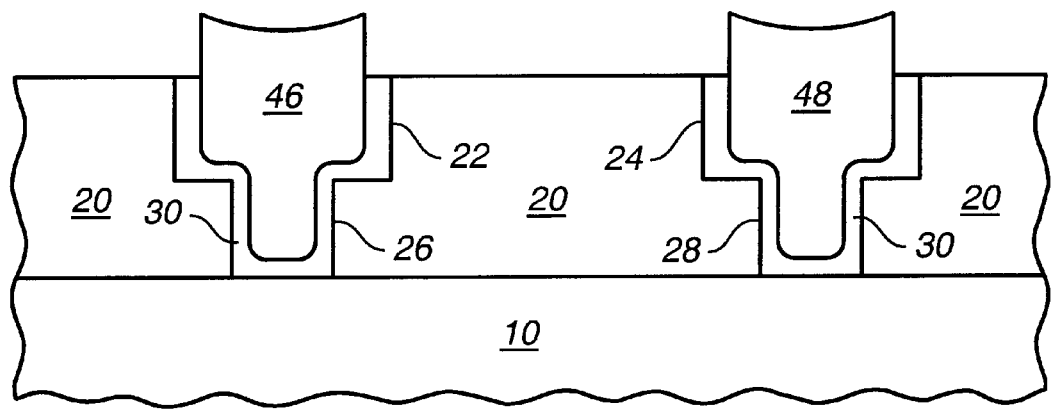
FIG._10
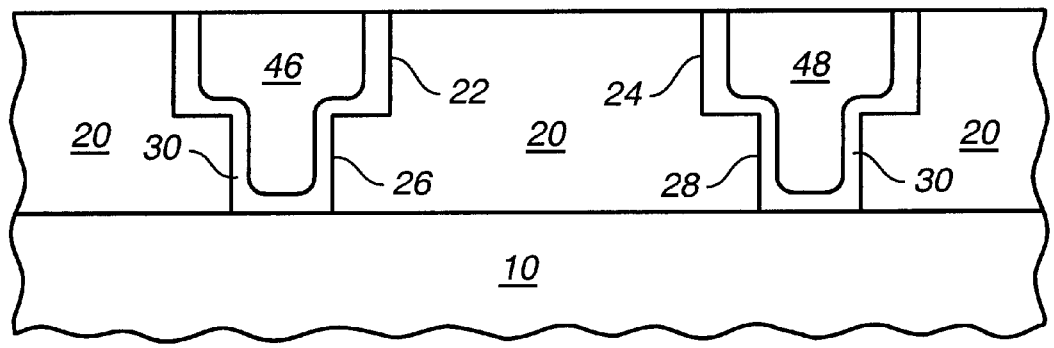
FIG._11

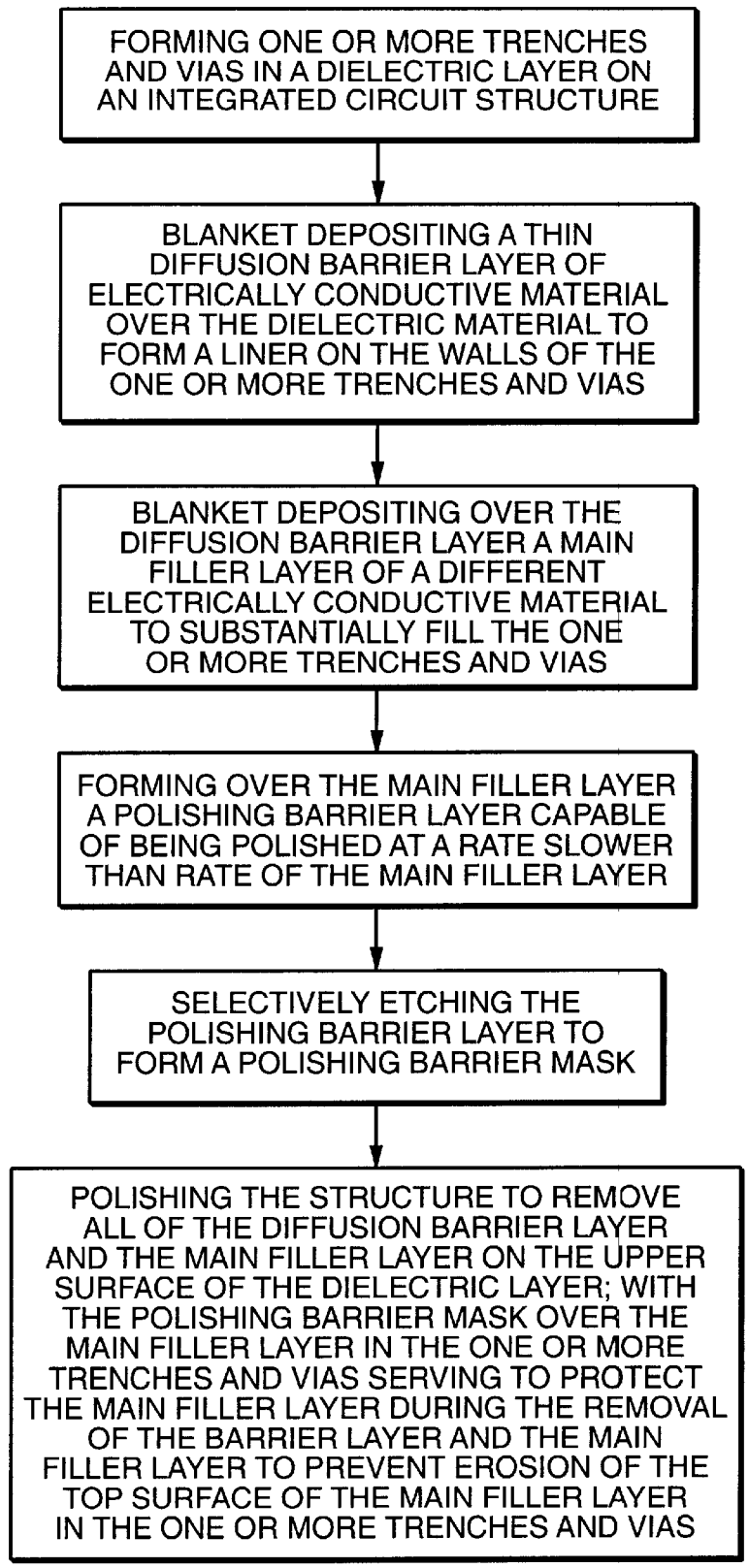
FIG._12

PROCESS FOR SELECTIVE POLISHING OF METAL-FILLED TRENCHES OF INTEGRATED CIRCUIT STRUCTURES

CROSS REFERENCE TO RELATED APPLICATIONS

The subject matter of this application relates to the subject matter of U.S. Pat. No. 6,391,768, issued May 21. 2002 entitled "PROCESS FOR CMP REMOVAL OF EXCESS TRENCH OR VIA FILLER METAL WHICH INHIBITS FORMATION OF CONCAVE REGIONS ON OXIDE SURFACE OF INTEGRATED CIRCUIT STRUCTURE", assigned to the assignee of this application, and filed on the same date as this application, the subject matter of which is hereby incorporated by reference.

The subject matter of this application relates to the subject matter of U.S. Pat. No. 6,423,630, issued Jul. 23, 2002 entitled "PROCESS FOR FORMING LOW K DIELECTRIC MATERIAL BETWEEN METAL LINES", assigned to the assignee of this application, and filed on the same date as this application, the subject matter of which is hereby incorporated by reference.

The subject matter of this application relates to the subject matter of U.S. patent application Ser. No. 09/704,200, entitled "PROCESS FOR FORMING INTEGRATED CIRCUIT STRUCTURE WITH LOW DIELECTRIC CONSTANT MATERIAL BETWEEN CLOSELY SPACED APART METAL LINES", assigned to the assignee of this application, and filed on the same date as this application, the subject matter of which is hereby incorporated by reference.

The subject matter of this application relates to the subject matter of U.S. Pat. No. 6,423,628, issued Jul. 23, 2002, filed on Oct. 22, 1999, entitled "METHOD OF FORMING INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", and assigned to the assignee of this application, the subject matter of which is hereby incorporated by reference.

The subject matter of this application relates to the subject matter of copending U.S. patent application Ser. No. 09/605, 380, filed on Jun. 27, 2000, entitled "COMPOSITE LOW DIELECTRIC CONSTANT FILM FOR INTEGRATED CIRCUIT STRUCTURE", and assigned to the assignee of this application, the subject matter of which is hereby incorporated by reference.

The subject matter of this application relates to the subject matter of U.S. Pat. No. 6,417,093, issued Jul. 9, 2002 filed on Oct. 31, 2000, entitled "PROCESS FOR PLANARIZATION OF METAL-FILLED TRENCHES OF INTEGRATED CIRCUIT STRUCTURES BY FORMING A LAYER OF PLANARIZABLE MATERIAL OVER THE METAL LAYER PRIOR TO PLANARIZING", and assigned to the assignee of this application, the subject matter of which is hereby incorporated by reference.

BACKGROUND OF THE INVENTION

1. Field of the Invention

This invention relates to the formation of integrated circuit structures. More particularly this invention relates to the planarizing, by chemical-mechanical polishing, of metal-filled trenches and/or vias of integrated circuit structures.

2. Description of the Related Art

Aluminum and tungsten metals have long been used in integrated circuit structures as filler materials for vias and contact openings as well as for the construction of metal lines or interconnects. However, with ever increasing demands for faster speeds, there has been renewed interest in the use of copper as a filler material for vias and contact openings instead of tungsten, as well as for use in metal lines instead of aluminum because of the well known low electrical resistance of copper, compared to either aluminum or tungsten.

But there are negative aspects to the choice of copper for via filling or in the formation of metal lines. The usual patterning of a blanket-deposited metal layer through a mask to form a pattern of metal lines or interconnects cannot easily be carried out using copper, resulting in the need to first deposit a dielectric layer such as silicon oxide, and then form a series of trenches in the dielectric layer corresponding to the desired pattern of metal lines or interconnects. The trench surfaces are then lined with a diffusion barrier layer or liner (to prevent migration of copper into the dielectric material, as well as to promote adhesion of the filler metal to the trench surfaces), and then filled with copper metal by first forming a copper seed layer over the barrier layer, e.g., by a CVD process, and then filling the remainder of the trench with a blanket deposition of copper, e.g., by a copper plating process.

Finally, the surface portions of both the diffusion barrier layer and the copper layer, formed over the top surface of the dielectric layer during the blanket depositions, are removed using a planarization process such as a chemical-mechanical polishing (CMP), leaving the desired pattern of metal lines or interconnects in the trenches, with the copper metal in the trenches separated from the silicon oxide sidewalls of the trench by the diffusion barrier layer.

While the copper lines or interconnects formed using such procedures provide the desired increased speed of the conductor, and the presence of the diffusion barrier layer between the copper and the silicon oxide dielectric material addresses the problem of diffusion of the copper ions or atoms into the silicon oxide sidewalls, the deposition of copper metal results in a non-planar upper surface of the deposited copper layer, which surface is characterized by depressed regions over the trenches filled by the copper deposition process. Subsequent removal of the surface portions of the copper layer by chemical-mechanical polishing (CMP) can result in dishing of the copper remaining in the trench in such a way that the dishing of the copper filling drops below the upper surface of the dielectric layer which defines the trench.

Turning now to prior art FIGS. 1–3, the formation of copper interconnects or lines in a dielectric layer of an integrated circuit structure, in accordance with the prior art, will be illustrated, using the so-called dual damascene process, it being understood that the same planarizing problems are also present when using the single damascene process. As shown in FIG. 1, a dielectric layer 20 may be formed over an integrated circuit structure 10 which may comprise active devices previously formed in an underlying silicon substrate and filled vias or contact openings previously formed in an underlying dielectric layer. Such vias or contact openings provide connection, for example, with underlying gate electrodes and source/drain regions of MOS devices of integrated circuit structure 10 formed in the silicon substrate, as is well known to those skilled in the art.

Still referring to FIG. 1 formed in dielectric layer 20, are trenches 22 and 24, and vias 26 and 28. Trenches 22 and 24, and vias 26 and 28, may be formed in dielectric layer 20, for example, by twice etching dielectric layer 20 through a resist mask, to divide dielectric layer 20 into the illustrated pattern of trenches and vias in dielectric layer 20 as is well known to those skilled in the art. Trenches 22 and 24, and vias 26 and 28, represent or illustrate a series of trenches and vias generally formed in dielectric layer 20 in a pattern corresponding to a desired array of metal lines and vias to electrically interconnect, for example, underlying gate electrodes and source/drain regions of MOS devices with other portions of the integrated circuit structure.

Over the surfaces of trenches 22 and 24, vias 26 and 28, and the illustrated upper surfaces of dielectric layer 20, is formed a highly conformal diffusion barrier layer 30 comprising and electrically conductive material, for example, tantalum metal, tantalum nitride, tungsten metal, tungsten nitride, titanium metal, or titanium nitride, or combinations of same. Diffusion barrier layer 30 is blanket deposited over the surfaces of trenches 22 and 24, vias 26 and 28, and the upper surface of dielectric layer 20, by a suitable deposition process such as chemical vapor deposition (CVD), plasma enhanced chemical vapor deposition (PECVD), physical vapor deposition (PVD), or any other suitable deposition process to a thickness of, for example, from about 100 Å to about 1000 Å.

Following the formation of barrier layer 30, a layer of copper metal 40 is blanket deposited over the structure by any suitable deposition process to completely fill the remaining portions of trenches 22 and 24 and vias 26 and 28, as well as depositing over the portions of barrier layer 30 previously deposited on the top surfaces of silicon oxide dielectric layer 20, as also shown in FIG. 1. This copper layer serves as the main metal conductor of trenches 22 and 24 and vias 26 and 28.

Following the blanket deposition of copper layer 40, the structure is subject to a chemical-mechanical polishing (CMP) process to remove all of the copper on the portions of diffusion barrier layer 30 on the top surfaces of dielectric layer 20, as shown in prior art FIG. 2, leaving only depressed copper portions 42 and 44 filling respective trenches 22 and 24 and vias 26 and 28. After removal of all copper from above the top surfaces of layer 20, the CMP process is continued to remove all portions of diffusion barrier layer 30 over the top surfaces of dielectric layer 20, leaving only a liner of diffusion barrier material on the walls of the trenches separating the copper metal in trenches 22 and 24 and vias 26 and 28 from the silicon oxide surfaces or walls of the trenches, as shown in prior art FIG. 3.

During the CMP planarization, copper layer 40 and barrier layer 30 are polished until the portions of copper layer 40 and barrier layer 30 lying above dielectric layer 20 are removed. Since CMP planarization is a conformal process, the depressed portions of layer 40 depicted in FIG. 1 continue to be depressed throughout the CMP process. The result, as shown in prior art FIG. 3, is a dished or depressed upper surface of the copper filler material in trenches 22 and 24, as shown, respectively, at 52-and 54 in trenches 22 and 24. Furthermore, while the problem of surface erosion of the metal trench filler material during CMP planarization has been discussed and illustrated, with respect to its occurrence with copper, the problem also exists when tungsten is used instead of copper, which includes, for example, in vias or contact openings where, tungsten is used more often as the filler material.

It would, therefore, be desirable to control the polishing of metal portions above trenches and vias in forming a pattern of metal interconnects or lines in previously formed trenches and/or vias in a layer of insulation material in order to reduce or prevent dishing of the metal surface of the filler metal in the trenches.

SUMMARY OF THE INVENTION

The invention provides a process for selectively polishing a main electrically conductive layer of an integrated; circuit structure by the steps of forming a polishing barrier layer over depressed regions of the main electrically conductive layer; and polishing the portion of the main electrically conductive layer not covered by the polishing barrier layer. The integrated circuit structure treated by the process of the invention contains one or more openings in a layer of dielectric material, and the main electrically conductive layer fills the one or more openings such that the depressed regions of the main electrically conductive layer overlie said one or more openings.

BRIEF DESCRIPTION OF THE DRAWINGS

FIG. 1 is a fragmentary vertical cross-sectional view of a prior art integrated circuit structure showing a layer of dielectric material on an integrated circuit structure with trenches and vias formed in the dielectric layer, a diffusion barrier layer lining the trenches and vias and also deposited over the upper surface of the dielectric layer, and a layer of the main electrically conductive filler material such as copper formed over the barrier layer to fill up the remainder of the trenches and vias.

FIG. 2 is a fragmentary vertical cross-sectional view of the prior art structure of FIG. 1 after a sufficient amount of the main electrically conductive filler layer has been removed to expose the portion of the diffusion barrier layer lying over the top surface of the dielectric layer.

FIG. 3 is a fragmentary vertical cross-sectional view of the prior art structure of FIG. 2 after the removal of the remainder of the diffusion barrier layer lying on the upper surface of the dielectric layer, showing the resultant dishing in the upper surface of the layer of the main electrically conductive material in the trenches and vias.

FIG. 4 is a fragmentary vertical cross-sectional view of the prior art structure of FIG. 1 after formation of a polishing barrier layer over the layer of the main electrically conductive filler material, in accordance with the invention, prior to the polishing step.

FIG. 5 is a fragmentary vertical cross-sectional view of the structure of FIG. 4 after a photoresist layer has been deposited over the polishing barrier layer, and the photoresist layer has been etched, leaving regions of photoresist material above the trenches and vias where dishing is present.

FIG. 6 is a fragmentary vertical cross-sectional view of the structure of FIG. 5, after the removal of regions of the polishing barrier layer not protected by the photoresist mask.

FIG. 7 is a fragmentary vertical cross-sectional view of the structure of FIG. 6, after the removal of all photoresist material, leaving regions of polishing barrier layer above the trenches and vias where dishing is present, such polishing barrier regions known as the polishing barrier layer.

FIG. 8 is a fragmentary vertical cross-sectional view of the structure of FIG. 7, during the process of chemical mechanical polishing (CMP) of the layer of the main electrically conductive filler material lying above the layer of dielectric material. During CMP, the regions of the main electrically conductive layer that lie beneath the polishing barrier layer are protected from polishing.

FIG. 9 is a fragmentary vertical cross-sectional view of a structure of FIG. 8, after completion of CMP, including the CMP process of removing portions of the diffusion barrier layer overlying the upper surfaces of the dielectric layer.

FIG. 10 is a fragmentary vertical cross-sectional view of a structure of FIG. 9, after removal of the polishing barrier layer. Regions of the main electrically conductive layer protected from polishing remain higher than the layer of dielectric material.

FIG. 11 is a fragmentary vertical cross-sectional view of the structure of FIG. 10 after an optional additional CMP step to even portions of the main electrically conductive layer with the upper surface of the layer of dielectric material.

FIG. 12 is a flow sheet illustrating one embodiment of the process of the invention.

DETAILED DESCRIPTION OF THE INVENTION

The invention provides a process for selectively polishing a main electrically conductive layer of an integrated circuit structure by the steps of forming a polishing barrier layer over depressed regions of the main electrically conductive layer; and polishing the portion of the main electrically conductive layer not covered by the polishing barrier layer. The integrated circuit structure treated by the process, of the invention contains one or more openings in a layer of dielectric material, and the main electrically conductive layer fills the one or more openings such that the depressed regions of the main electrically conductive layer overlie said one or more openings. In one embodiment of the invention, the integrated circuit structure contains a diffusion barrier layer underlying the main electrically conductive layer. In another embodiment of the invention, the main electrically conductive layer comprises copper.

Layers

The layer of the main electrically conductive filler material, also referred to herein as the filler layer or the main electrically conductive layer, will comprise a material having superior electric conductivity. Examples of such electrically conductive materials include metals such as copper, tungsten, and aluminum. The minimum thickness of the filler layer will comprise that amount which will fill most or all of the trench after the polishing step. Typically, the filler layer will have a thickness that is approximately twice the trench depth.

In a preferred embodiment, the main electrically conductive layer consists essentially of copper and alloys of copper. In this embodiment, a copper or copper alloy layer will typically be deposited onto the integrated circuit structure using known processes that include a sputtering step to provide a seed layer, which is followed by an electroplating step. Alloys of copper, as used herein, refer to alloys comprising at least about 95 weight percent copper. In one example, the copper layer can be mixed with magnesium. In this case, a preferential (self) diffusion barrier layer forms at the interface of the copper and dielectric layers in such an instance, and no separate diffusion barrier layer is necessary.

The polishing barrier layer can comprise any material capable of being polished by a CMP process at a rate slower than the rate at which the main electrically conductive layer and/or diffusion barrier layer is polished. Typically, the polishing barrier layer will also be capable of being removed in subsequent processing steps without damaging the underlying integrated circuit structure, and the material will not react with the underlying main electrically conductive layer.

Examples of materials that can be used to form the polishing barrier layer include silicon carbide, silicon nitride, silicon oxynitride, tantalum, tantalum nitride, titanium, and titanium nitride. The polishing barrier layer can be blanket deposited over the surface of the main electrically conductive layer using any suitable deposition process such as chemical vapor deposition (CVD), plasma enhanced chemical vapor deposition (PECVD), or physical vapor deposition.

The polishing barrier layer will have a thickness sufficient to protect underlying portions of the main electrically conductive layer during polishing steps. In one embodiment, the thickness will be sufficient to protect underlying main electrically conductive layer portions from being polished at least until the protected portions of the underlying main electrically conductive layer portions are no longer lower than the unprotected portions of the main electrically conductive layer.

In another embodiment, the thickness will be sufficient to ensure that the portions of the main electrically conductive layer filling the underlying trenches and vias are not polished below the upper surface of the dielectric layer during the process of removing the portions of the main electrically conductive layer and diffusion barrier layer that lie above the upper surface of the dielectric layer. Regardless of the original thickness of the polishing barrier layer, it will be understood that so long as the polish barrier layer is overlying portions of the main electrically conductive layer, the main electrically conductive layer will be protected from erosion during polishing steps.

In one embodiment, polishing steps will erode and eventually remove the polishing barrier layer; after removal of the polishing barrier layer, the main electrically conductive layer will no longer have protected portions and accordingly such formerly protected portions will begin to erode as a result of polishing. The desired thickness of the polishing barrier layer will be influenced by a variety of factors including the polishing rate of the polishing barrier layer relative to the polishing rate of the main electrically conductive layer and/or the polishing rate of the diffusion layer barrier, the thickness of the main electrically conductive layer, the thickness, of the diffusion barrier layer, the depth of the depressions in the main electrically conductive layer that are in the trenches and vias of the, integrated circuit structure, and the desired final height of the electrically conductive portions filling trenches and vias in the integrated circuit structure. A polishing barrier layer of, for example, tantalum nitride will typically vary from about 500 Å to 1000 Å.

When the polishing barrier layer is completely removed during or after the polishing step, the planarizable polishing barrier layer can comprise either electrically conductive material or electrically non-conductive material. However, when not all the planarizable layer is removed during or after the polishing step, the polishing barrier layer should comprise an electrically conductive material such as, for example, tantalum, tantalum nitride, titanium, titanium nitride, and the like.

In one embodiment, the integrated circuit structure will contain a diffusion barrier layer. The diffusion barrier layer will comprise a material capable of being deposited over dielectric surfaces as a highly conformal layer which is capable of forming a barrier layer to prevent diffusion of the material of the main electrically conductive layer into the dielectric material and also capable of promoting adhesion between the dielectric material and the main electrically conductive layer. Thus, the diffusion barrier layer will form a lining on the surface of the dielectric layer in such a way as to lie between the dielectric layer and the main electrically conductive layer. The diffusion barrier layer will typically comprise an electrically conductive material, although the material of the diffusion barrier layer may often be a poorer electric conductor relative to the material of the main electrically conductive layer. Examples of electrically conductive materials suitable to be used in the diffusion barrier layer include: tantalum metal, tantalum nitride, tungsten metal, tungsten nitride, titanium metal, or titanium nitride, or combinations of same. The diffusion barrier layer can comprise more than one material. For example, when the main electrically conductive layer comprises copper, the diffusion barrier layer can comprise a layer of tantalum and a layer of tantalum nitride over the tantalum layer. The diffusion barrier layer may be blanket deposited over the integrated circuit structure, including the surfaces of the trenches and vias, and the upper surface of the dielectric layer, by any suitable deposition process such as chemical vapor deposition (CVD), plasma enhanced chemical vapor deposition (PECVD), or physical vapor deposition to at least a thickness sufficient to provide the desired diffusion barrier protection, while not exceeding a thickness that interferes with subsequent filling of the trench with the material of the main electrically conductive layer. The thickness of a diffusion barrier layer will typically range from about 50 Å to about 400 Å.

Integrated Circuit Structure

The process of the invention finds particular utility with respect to the protection of electrically conductive filler material in trenches and vias during subsequent polishing steps, such as CMP, used to remove portions of the electrically conductive filler material blanket deposited on the upper surface of the dielectric material in which the trenches and vias are formed. While the process of the invention is described herein for treating an integrated circuit structure having filler material present in trenches and vias, it will be understood that the process of the invention is useful for a variety of underlying integrated circuit structures, including integrated circuit structures containing filler material in trenches, vias, contact openings, or combinations thereof. For example, the process of the invention is useful for integrated circuit structures that contain copper filler material deposited using a single damascene process (containing copper in trenches) or dual damascene process (containing copper in trenches and vias). As used herein, the term "openings" (when not used in conjunction with "contact" as in the term "contact openings") refers generally to structural features of an integrated circuit structures into which features is deposited the electrically conductive filler material; such openings include trenches, vias, and contact openings.

The process of the invention will be particularly useful for integrated circuit structures containing deep and/or wide openings containing filler material, which structures, as a result, contains depressions in the surface of the filler layer as a result of filling the deep and/or wide opening in the integrated circuit structure. The process of the invention also will be useful for the CMP treatment of integrated circuit structures containing metal filler material in the main electrically conductive layer in the openings of the integrated circuit structure, particularly when the metal filler material is copper.

Description of the steps of the invention

In accordance with the process of the invention, a polishing barrier layer or mask is formed, which barrier layer serves to protect the underlying portions of the main electrically conductive layer during one or more subsequent polishing steps. The polishing barrier layer can be formed using any method capable of selectively forming a pattern of a particular material overlying another material. Typically, the polishing barrier layer will be formed using known mask and etch techniques. Alternatively, the polishing barrier layer can be formed using an abrasive which is more mechanical in nature, such as a fixed abrasive or a highly selective abrasive, e.g., cerium oxide.

Following the formation of the polishing barrier layer, the process of the invention continues with a step of polishing the portion of the main electrically conductive layer not covered by the polishing barrier layer. The polishing process is used to remove the portion of the main electrically conductive layer overlying the upper surface of the dielectric layer. When the diffusion barrier layer also is present in the integrated circuit structure, the same or different polishing step is then used to remove the portion of the diffusion barrier layer overlying the upper surface of the dielectric layer. The polishing process used to remove the diffusion barrier layer and main electrically conductive layer from the upper surface of the dielectric layer preferably comprises a chemical-mechanical polishing (CMP) process where the chemical etchant and mechanical abrasive in the CMP slurry are chosen according to the particular material or materials to be polished. For example, when the material making up the main electrically conductive layer comprises copper, a CMP slurry containing hydrogen peroxide ($H_2O_2$) and alumina ($Al_2O_3$), as major components, can be used to polish away the unwanted copper. An example of such a CMP slurry is commercially available from, for example, the Cabot Company as Cabot iCue 5001.

When tantalum and/or tantalum nitride are used as the diffusion barrier layer, the polishing barrier layer, or both, a CMP slurry containing hydrogen peroxide ($H_2O_2$) and colloidal silica ($SiO_2$), as major components, can be used to polish away these materials. Such a slurry is commercially available from, for example, Rodel as solutions CuS1201A and CuS1201B (which are put together in use). In addition to CMP, polishing can be carried out using fixed abrasive polishing, which polishes portions of a structure according to their height. For example, fixed abrasive polishing can use a cerium oxide abrasive, using an alkaline solution containing, for example, ammonium hydroxide or potassium hydroxide.

Overview of the process of the invention

Turning now to FIGS. 4–10, an embodiment of the process of the invention is illustrated. As seen in FIG. 4, before polishing the structure of prior art FIG. 1 to remove the portions of main electrically conductive layer 40 and diffusion barrier layer 30 from the upper surface of the dielectric layer, a polishing barrier layer 60 is formed over main electrically conductive layer 40. Dielectric layer 20 is presented in FIGS. 4–10 as a single dielectric layer; however, one skilled in the art will recognize that dielectric layer 20 can comprise one or more different dielectric materials formed by any known methods. For example, dielectric layer 20 can comprise two different dielectric materials when dielectric layer 20 is formed by a dual damascene process which uses a different dielectric material for each of the two depositions of dielectric material. Accordingly, as used herein, the "dielectric layer" underlying the diffusion barrier layer or main electrically conductive layer is understood to refer to a layer containing one or more sub-layers of the same or different dielectric material.

In FIG. 5, the process of the invention is shown after formation of a photoresist mask. A photoresist layer is deposited over polishing barrier layer 60 and patterned to leave mask portions 82 and 84 which lie above the trenches 22 and 24 and vias 26 and 28 of the integrated circuit structure. Formation of the photoresist mask can be carried out using any of a variety of methods known in the art. For example, a photoresist layer can be deposited over the polishing barrier layer, exposed to a light pattern, where the exposed portions of the photoresist material are then removed, leaving the photoresist mask.

The portions of the polishing barrier layer not protected by the photoresist mask are then removed by chemical wash or etching. FIG. 6 shows that the photoresist mask regions 82 and 84 protect particular underlying polishing barrier regions, labelled 62 and 64, respectively, from the erosion by chemical wash. The photoresist mask regions 82 and 84 are then removed to leave a patterned polishing barrier layer shown as regions 62 and 64 in FIG. 7. Thus the use of a photoresist mask formed using mask and etch methodology results in a patterned polishing barrier layer 62 and 64 that corresponds to the photoresist mask. As discussed above, an alternative method to form the polishing barrier layer is by fixed abrasive polishing; in this case, the pattern of the polishing barrier layer will be determined by the pattern of depressed regions in the underlying main electrically conductive layer.

After formation of the patterned polishing barrier layer, the integrated circuit structure can then be subjected to polishing. Typically this is carried out using CMP. As seen in FIG. 8, the portions of the main electrically conductive layer 40 not protected by the polishing barrier layer regions 62 and 64 will be degraded by the polishing process. As polishing continues, the portions of main electrically conductive layer 40 overlying the upper surfaces of dielectric layer 20 are completely removed. Polishing continues in order to remove portions of diffusion barrier layer 30 overlying the upper surfaces of dielectric layer 20. In removing these portions of diffusion barrier layer 30, the polishing method can be a continuation of the same polishing method used to remove portions of main electrically conductive layer 40 or can be a different polishing method. One of skill in the art will determine whether to use the same or different polishing methods and the reagents to be used according to the materials used to form main electrically conductive layer 40 and diffusion barrier layer 30. Also, the same polishing slurry of CMP can be used to remove 62, 64, and layer 30 if the material used is the same.

FIG. 9 shows the integrated circuit structure after complete removal of portions of main electrically conductive layer 40 and diffusion barrier layer 30 overlying the upper surfaces of dielectric layer 20. The resultant structure contains segments 46 and 48 of electrically conductive material which fill trenches 22 and 24 and vias 26 and 28. Segments 46 and 48 are shown as rising above the upper surface of dielectric layer 20, indicating that segments 46 and 48 which contain electrically conductive material do not exhibit depression or "dishing" which occurs using prior art methodology (see FIG. 3).

Polishing layer regions 62 and 64 can then be removed using one of a variety of methods including: (a) CMP capable of removing the material contained in polish regions 62 and 64; (b) fixed abrasive polishing for removing the highest portions of the integrated circuit structure which would now comprise polishing layer regions 62 and 64; (c) chemical wash using a reagent capable of removing the material contained in polish regions 62 and 64; and (d) CMP using a highly planarizing slurry, e.g., with cerium oxide in the slurry. Alternatively, when polish regions 62 and 64 comprise electrically conductive material such as tantalum, tantalum nitride, titanium, or titanium nitride, regions 62 and 64 may be left on the structure. After removal of polishing layer regions 62 and 64, the integrated circuit structure contains electrically conductive segments 46 and 48 which rise above the upper surface of dielectric layer 20, shown in FIG. 10.

In some instances, it will be desirable to maintain electrically conductive segments 46 and 48 above the upper surface of dielectric layer, as shown in FIG. 10, resulting in an "overburden" of electrically conductive material over trenches 22 and 24. In other instances, it will be desirable to reduce or eliminate the overburden, which can be carried out by, for example, CMP planarization of electrically conductive segments 46 and 48 until segments 46 and 48 have the same height as the upper surface of dielectric layer 20, as shown in FIG. 11.

As an alternative to removing polishing barrier layer regions 62 and 64 in a separate step following removal of portions of diffusion barrier layer 30 and main electrically conductive layer 40 that overlie the upper surface of dielectric layer 20, polishing barrier layer regions 62 and 64 can be removed during the same step of removal of the portions of diffusion barrier layer 30 and/or main electrically conductive layer 40 that overlie the upper surface of dielectric layer 20. This simultaneous removal can be carried out while still providing protection to portions of main electrically conductive layer covered by the polishing barrier layer by appropriate selection of the thickness of the polishing barrier layer and one or more reagents for polishing the diffusion barrier layer, main electrically conductive layer, and polishing barrier layer. The appropriate selection of the polishing reagents will be influenced by chemical composition of the various layers to be polished and by the depth of the depressions in the main electrically conductive layer (i.e., the height differential between the upper surface of the main electrically conductive layer overlying an opening in the integrated circuit structure and the upper surface of the main electrically conductive layer not overlying such an opening).

It should be noted at this point that the respective steps of removal of portions of diffusion barrier layer 30 (FIGS. 9) and removal of polishing barrier layer regions 62 and 64 (FIG. 10) could carried out in a single step under certain circumstances. That is, complete removal of portions of main electrically conductive layer 40 and diffusion barrier layer 30 overlying the upper surfaces of dielectric layer 20, as described above and illustrated in FIG. 9, may be carried out simultaneously with removal of polishing layer regions 62 and 64, in a single step if polishing barrier layer 60 and diffusion barrier layer 30 comprised the same material and the relative thicknesses of the two layers were adjusted so that the removal of all of barrier layer 40 either coincided with or just preceded removal of polishing layer regions 62 and 64 above the copper in the trenches.

One skilled in the art will recognize that a variety of polishing reagents and materials for main electrically conductive layer, diffusion barrier layer and polishing barrier layer can be selected. Additionally, the amount of overburden can be selected. By manipulating the thicknesses of the various layers and the composition and number of different polishing reagents used, the final height of electrically conductive segments 46 and 48 can be controlled. Use of a polishing barrier layer also provides the advantage of permitting the skilled artisan to select the desired materials for the diffusion barrier layer and main electrically conductive layer without being limited to the relative polishing rates of these materials. Furthermore, use of the polishing barrier layer permits the skilled artisan to compensate for any non-uniformities in the portions of the main electrically conductive layer and/or diffusion barrier layer which overlie the upper surface of the dielectric layer because, by use of a polishing barrier layer, complete removal of these portions can be affected without risking forming depressions in the main conductive portions filling openings in the integrated surface structures (i.e., without forming depressions in electrically conductive segments 46 and 48).

While the above description of removal steps referred only to the use of polishing methods, it will be recognized that such removal steps can be carried out using non-polishing methods as well. For example, as one step in the removal of the various layers, a chemical reagent can be used to remove the polishing barrier layer. For example, when the polishing barrier layer is silicon nitride, the polishing barrier layer can be removed using a plasma containing $CHF_3$ and $O_2$.

In one embodiment of the invention, as depicted in the flow sheet of FIG. 12, the process comprises forming one or more trenches and vias in a dielectric layer on an integrated circuit structure, and then blanket depositing a thin diffusion barrier layer of electrically conductive material over the dielectric material to form a liner on the walls of the one or more trenches and vias. Next, the process includes blanket depositing over the diffusion barrier layer a main filler layer of a different electrically conductive material to substantially fill the one or more trenches and vias. The process continues by forming over the main filler layer a polishing barrier layer capable of being polished at a rate slower than rate of the main filler layer, and then selectively etching the polishing barrier layer to form a polishing barrier mask. Finally, the process includes a step of polishing the structure to remove all of the diffusion barrier layer and the main filler layer on the upper surface of the dielectric layer; with the polishing barrier mask over the main filler layer in the one or more trenches and vias serving to protect the main filler layer during the removal of the barrier layer and the main filler layer to prevent erosion of the top surface of the main filler layer in the one or more trenches and vias.

While the foregoing description of the process of the invention relates to its use in the dual damascene type structure, it will be readily appreciated by those skilled in the art that the same improvements can be used in a single damascene process as well where previously formed vias or trenches are lined and filled with materials to form the diffusion barrier layer and the main electrically conductive layer.

Example

To further illustrate the invention, two silicon wafers may have formed thereon a 650 nanometer (nm) thick silicon oxide dielectric layer with one or more 10×10 square micrometer ($\mu m^2$)×350 nm deep trenches formed therein. A 25 nm thick layer of tantalum is blanket deposited over both wafers to form a liner on the walls of the respective trenches. A sufficiently thick layer of copper is then blanket deposited over the tantalum layer on both wafers to completely fill up the respective trenches with copper. The second wafer is then subject to a further blanket deposit of silicon nitride, having a thickness of about 50 nm.

The second wafer is then subject to photolithography to form a photoresist layer over the silicon nitride overlying depressed portions of the underlying copper filler material. Portions of silicon nitride not covered by the photoresist mask are degraded by exposing the second wafer to a plasma containing $CHF_3$ and $O_2$. The photoresist mask is then removed from the second wafer, leaving a patterned polishing barrier layer.

Both wafers are then subjected to a first CMP step using a Cabot iCue 5001 slurry designed for copper removal, and containing hydrogen peroxide and particulate alumina as the abrasive, to polish the copper. Both wafers would then be subjected to CMP planarizing of the copper until the tantalum barrier layer beneath the copper layer becomes exposed in the regions over the top surface of the dielectric layer (non-trench regions). The CMP slurry would then be changed to a slurry containing Rodel CuS1201A and CuS1201B, which is a slurry containing hydrogen peroxide and colloidal silica as the abrasive to polish tantalum. Tantalum polishing would continue until the top surface of the underlying dielectric layer is exposed on both wafers.

The second wafer is then exposed to a plasma containing $CHF_3$ and $O_2$ to remove the polishing barrier layer. Treatment of the second wafer can be stopped at this point or can optionally continue with another copper polishing step using Cabot iCue 5001 until the level of the copper filling the trenches is even with the upper level of the dielectric layer.

The wafers are then removed from the polishing station, rinsed, and dried, and then examined using a profilometer. The surfaces of the copper-filled trenches on the wafer not having the polishing barrier layer deposited over the copper layer will be found to be eroded, leaving concave or dished upper surfaces in the trenches, due to attack and erosion of the unprotected copper overlying the trenches. The surfaces of the copper-filled trenches on the second wafer (which utilized the polishing barrier layer in accordance with the invention) will be found to be higher than the upper surface of the dielectric layer or substantially planar with the dielectric layer, i.e., not significantly dished compared to the first wafer, due to the protection afforded the upper surface of the copper filler in the trenches during the tantalum and copper polishing steps.

Thus, the invention provides an improved process for forming metal lines or interconnects in a previously formed pattern of trenches in a dielectric layer, as well as for forming filled vias and contact openings, and combinations thereof, wherein erosion or dishing of the upper surface of the main electrically conductive filler material such as copper, tungsten, or aluminum is prevented or inhibited by the provision of a polishing barrier layer over the upper surfaces of such copper, tungsten, or aluminum material in trenches (or vias) during the removal of surfaces portions of the main electrically conductive filer material and the underlying barrier layer.

Having thus described the invention what is claimed is:

1. A process for selectively polishing, on an integrated circuit structure containing one or more openings in a layer of dielectric material, a main electrically conductive layer of said integrated circuit structure and a diffusion barrier layer lining lying adjacent to said layer of dielectric material, wherein said diffusion barrier layer lining and said main electrically conductive layer fill said one or more openings such that said depressed regions of said main electrically conductive layer overlie said one or more openings, said process comprising the steps of:

(a) using a photoresist mask and etching process, forming, over depressed regions of said main electrically conductive layer, a polishing barrier layer selected from the group consisting of silicon carbide, silicon nitride, silicon oxynitride, tantalum, tantalum nitride, titanium, and titanium nitride;

(b) polishing the portion of said main electrically conductive layer not covered by said polishing barrier layer; and (c) then, in a second polishing step, removing portions of said diffusion barrier layer overlying the upper surface of said dielectric layer.

2. The process of claim 1 wherein said openings comprise trenches.

3. The process of claim 1 wherein said openings comprise vias and/or contact openings.

4. The process of claim 1 wherein said openings comprise trenches formed therein, and further comprises one or more vias or contact openings therein formed in registry with said trenches.

5. The process of claim 4 wherein said trenches and said vias or contact openings contain a diffusion barrier layer lining said dielectric layer, and said trenches and said vias or contact openings further contain an electrically conductive material selected from the group consisting of copper, tungsten, and aluminum.

6. The process of claim 1 wherein said polishing step comprises a chemical-mechanical polishing process.

7. The process of claim 1 wherein said polishing barrier layer forming step comprises a fixed abrasive polishing process.

8. The process of claim 1 wherein said polishing barrier layer is removed during said polishing step.

9. The process of claim 1 wherein said main electrically conductive layer comprises a metal.

10. The process of claim 9 wherein said metal is selected from the group consisting of copper, tungsten, and aluminum.

11. The process of claim 1 wherein said main electrically conductive layer comprises copper.

12. The process of claim 1 wherein said said diffusion barrier layer comprises a material selected from the group consisting of tantalum, tantalum nitride, titanium, and titanium nitride.

13. The process of claim 1 wherein said main electrically conductive layer comprises copper and said diffusion barrier layer comprises a layer of tantalum and a layer of tantalum nitride.

14. The process of claim 1 wherein said polishing barrier layer is removed during said second polishing step.

15. The process: of claim 1 further comprising a step of removing said polishing barrier layer.

16. The process of claim 1, wherein said polishing barrier layer forming step comprises depositing a polishing barrier layer over said main electrically conductive layer and depositing a photoresist layer over said polishing barrier layer.

17. The process of claim 16, wherein said polishing layer forming step further comprises forming a photoresist mask and removing regions of said polishing barrier layer not protected by said photoresist mask.

18. The process of claim 17, wherein said regions of polishing barrier layer not protected by said photoresist mask are removed by chemical wash or etching.

19. The process of claim 1, wherein the pattern of said polishing barrier layer corresponds to a photoresist mask.

20. The process of claim 1, wherein the portion of said main electrically conductive layer underlying said polishing barrier layer is protected from being polished at least until said underlying main electrically conducting layer portion is no longer lower than said portion of the main electrically conducting layer not covered by said polishing barrier layer.

21. The process of claim 8, further comprising polishing regions of said electrically conductive layer overlying said one or more openings after removal of said polishing barrier layer.

22. The process of claim 8, wherein not all of said polishing barrier layer is removed.

23. The process of claim 1, wherein said diffusion barrier layer and said polishing barrier layer comprise the same material.

24. The process of claim 1, wherein complete removal of said diffusion barrier layer coincides with complete removal of said polishing barrier layer.

25. The process of claim 1, wherein regions of said main electrically conductive layer in said one or more openings comprise a selectable amount of overburden.

26. The process of claim 14, wherein the method used to polish said main electrically conductive layer not covered by said polishing barrier layer is different than the method used to polish said polishing barrier layer.

27. A process for selectively polishing a main electrically conductive layer and a diffusion barrier layer of an integrated circuit structure wherein said integrated circuit structure contains one or more openings in a layer of dielectric material lined with material comprising said diffusion barrier layer, and said main electrically conductive layer and said diffusion barrier layer fill said one or more openings such that depressed regions of said main electrically conductive layer overlie said one or more openings, said process comprising the steps of:

(a) depositing a polishing barrier layer over said main electrically conductive layer;

(b) using a photoresist mask and etch process to remove selected portions of said polishing barrier layer to form a patterned polishing barrier layer covering depressed regions of said main electrically conductive layer;

(c) polishing the portion of said main electrically conductive layer and said diffusion barrier layer not covered by said patterned polishing barrier layer; and (d) polishing said structure in a second polishing step to remove portions of said diffusion barrier layer covering the upper surface of said dielectric material;

whereby said patterned polishing barrier layer is removed during the same polishing step as removal of portions of said diffusion barrier layer not covered by said patterned polishing barrier layer.

28. The process of claim 27 wherein said polishing step comprises a chemical-mechanical polishing process.

29. The process of claim 27 wherein said main electrically conductive layer comprises copper.

30. In a process for forming an integrated circuit structure wherein openings are formed in a predetermined pattern in a dielectric layer, lined with a diffusion barrier layer, and then filled with an electrically conductive material, and said structure is then polished to remove said electrically conductive material from the upper surface of said dielectric layer, the improvements which comprise:

(a) before said polishing step, depositing over said main electrically conductive layer a polishing barrier layer comprising the same material as said diffusion barrier layer;

(b) depositing a photoresist layer over said polishing barrier layer;

(c) using a photoresist mask and etch process to remove selected portions of said polishing barrier layer to form a patterned polishing barrier layer over regions of said main electrically conductive layer that overlie said openings in said dielectric layer; and (d) polishing the portion of said main electrically conductive layer not covered by said polishing barrier layer.

31. An integrated circuit device formed using a process for selectively polishing a main electrically conductive layer of an integrated circuit structure wherein said integrated circuit structure contains one or more openings in a layer of dielectric material lined with a diffusion barrier layer, and said main electrically conductive layer fills said one or more lined openings such that said depressed regions of said main electrically conductive layer overlie said one or more openings comprising the steps of:

(a) depositing over said main electrically conductive layer a polishing barrier layer comprising the same material as said diffusion barrier layer;

(b) depositing a photoresist layer over said polishing barrier layer;

(c) using a photoresist mask and etch process to remove selected portions of said polishing barrier layer to form a patterned polishing barrier layer over regions of said main electrically conductive layer that overlie said openings in said dielectric layer; and (d) polishing the portion of said main electrically conductive layer not covered by said polishing barrier layer.

* * * * *